United States Patent
Yoshida et al.

(10) Patent No.: US 6,521,140 B2
(45) Date of Patent: Feb. 18, 2003

(54) COMPOSITE MAGNETIC BODY AND ELECTROMAGNETIC INTERFERENCE SUPPRESSING BODY USING THE SAME

(75) Inventors: Shigeyoshi Yoshida, Abiko (JP); Norihiko Ono, Yokohama (JP)

(73) Assignee: NEC Tokin Corp., Miyagi (JP)

(*) Notice: Subject to any disclaimer, the term of this patent is extended or adjusted under 35 U.S.C. 154(b) by 0 days.

(21) Appl. No.: 09/818,046

(22) Filed: Mar. 27, 2001

(65) Prior Publication Data

US 2001/0038086 A1 Nov. 8, 2001

Related U.S. Application Data

(63) Continuation of application No. 09/068,167, filed as application No. PCT/JP97/03128 on Sep. 5, 1997, now abandoned.

(30) Foreign Application Priority Data

Sep. 6, 1996 (JP) .............................. 8-236554

(51) Int. Cl.[7] .......................... H01Q 17/00; C03C 14/00
(52) U.S. Cl. ................ 252/62.54; 252/62.55; 307/91; 361/816; 361/818
(58) Field of Search .................. 307/91; 252/62.54, 252/62.55; 361/816, 818

(56) References Cited

U.S. PATENT DOCUMENTS

| 3,926,644 A | * 12/1975 | Kaye ........................ 424/311 |
| 4,474,676 A | * 10/1984 | Ishino et al. ............. 252/62.54 |
| 5,827,445 A | * 10/1998 | Yoshida et al. .......... 252/62.54 |
| 5,864,088 A | * 1/1999 | Sato et al. ............. 174/35 MS |

FOREIGN PATENT DOCUMENTS

| JP | 61-83400 | * 4/1986 |
| JP | 5-251222 | * 9/1993 |

* cited by examiner

Primary Examiner—C. Melissa Koslow
(74) Attorney, Agent, or Firm—Bradley N. Ruben PC

(57) ABSTRACT

In a composite magnetic body comprising flat soft magnetic powder dispersed in an organic binding agent, biodegradable plastic is used as the organic binding agent so that the composite magnetic body is free of possibility of pollution due to disposal thereof. As the biodegradable plastic, any of a microbe-generated type, a chemically-synthesized type and a natural high molecular weight type is used.

6 Claims, 2 Drawing Sheets

US 6,521,140 B2

COMPOSITE MAGNETIC BODY AND ELECTROMAGNETIC INTERFERENCE SUPPRESSING BODY USING THE SAME

This application is a continuation of application Ser. No. 09/068,167, filed May 4, 1998, now abandoned which is a 371 of PCT/JP97/03128 filed Sep. 5, 1997.

TECHNICAL FIELD

The present invention relates to a composite magnetic body applied in an electronic device for suppressing electromagnetic interference.

BACKGROUND ART

In electronic devices, interference due to electromagnetic waves from the exterior or interference given to external devices due to electromagnetic waves radiated from the subject device, that is, so-called electromagnetic interference becomes a problem. This electromagnetic interference problem becomes more significant following use of the higher frequency and reduction in size and power of electronic devices.

For suppressing such electromagnetic interference, electromagnetic shielding by a conductor plate has been conventionally used. However, there is a problem that although the conductor plate blocks transmittance of the electromagnetic waves, it induces secondary radiation due to reflection. Specifically, although it protects an electronic device from electromagnetic waves from the exterior of the device, the secondary radiation due to the reflection influences the external devices. Further, it reflects electromagnetic waves from the inside of the device toward the inside of the device so that other electronic components in the same device are adversely affected. In addition, since components of such undesired electromagnetic waves extend over a wide frequency range, particularly in high frequency devices, there are not a few cases wherein it is difficult to even identify frequency components relating to the electromagnetic interference.

Accordingly, for suppressing the foregoing electromagnetic interference, such a material is desired that absorbs undesired electromagnetic waves over the wide frequencies.

As a material satisfying such a request, JP-A-7-212079 offers a composite magnetic body in which soft magnetic powder having a shape anisotropy is dispersed into an organic binding agent. This composite magnetic body utilizes, for absorption of the electromagnetic waves, magnetic losses over several ten MHz to several GHz which are considered to appear due to a plurality of magnetic resonances of the soft magnetic powder.

The foregoing JP-A-7-212079 discloses an electromagnetic interference suppressing body wherein the composite magnetic body and a conductor are stacked with each other so that transmittance of the electromagnetic waves is blocked by the conductor layer while the electromagnetic waves are absorbed by the composite magnetic body, thereby preventing invasion and reflection of the electromagnetic waves.

On the other hand, in recent years, demands have become stronger relative to many industrial products that they produce no harmful substances and are completely decomposed spontaneously to leave no residue when disposed of, or they have high recyclability. However, the foregoing electromagnetic interference suppressing body or composite magnetic body being a material thereof pays no consideration to such demands.

The present invention has been made for solving such problems and provides a composite magnetic body which can ensure safety upon disposal thereof, can be spontaneously decomposed and has high recyclability, and an electromagnetic interference suppressing body using it.

DISCLOSURE OF THE INVENTION

The present invention, as recited in the claims provides a composite magnetic body comprising flat soft magnetic powder dispersed in an organic binding agent, which is characterized in that the organic binding agent is biodegradable plastic.

Various embodiments of the composite magnetic body according to the present invention are recited in various dependent claims.

Further, the present invention, as recited in claim 4, provides an electromagnetic interference suppressing body comprising the foregoing composite magnetic body and a conductive material.

BEST MODE FOR CARRYING OUT THE INVENTION

Hereinbelow, embodiments of a composite magnetic body of the present invention and an electromagnetic interference suppressing body using it will be explained in detail with reference to the drawings.

Figure 1:
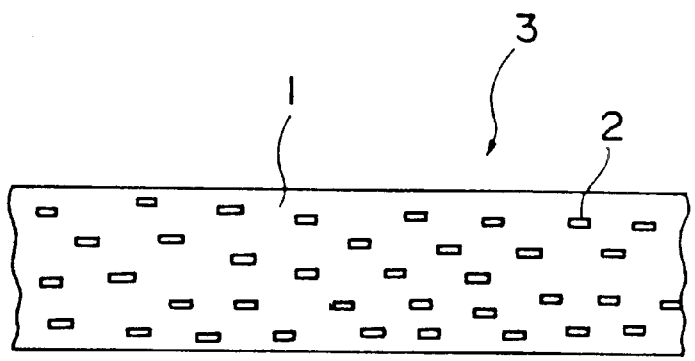
FIG. 1 is a side sectional view showing a basic structure of a composite magnetic body of the present invention.

FIG. 1 is a side sectional view showing a basic structure of a composite magnetic body 3 of the present invention. The composite magnetic body 3 is an insulating soft magnetic body formed by dispersing flat soft magnetic powder 2 into an organic binding agent 1, and holding a desired magnetic characteristic. As the organic binding agent 1, biodegradable plastic is used. For the biodegradable plastic, there are a microbe type, a chemical synthesis type and a natural high molecular weight type. A product from any of them is used. The soft magnetic powder 2 may be iron powder or alloy powder comprising at least Fe and Si.

The composite magnetic body 3 is convenient for disposal or recycling, since the organic binding agent 1 of biodegradable plastic occupying a considerable part of the volume thereof is liable to be decomposed with a lapse of time after disposed of, and since the iron powder or the alloy powder comprising Fe and Si is used for the soft magnetic powder 2 as another main constituent element and insures the safety.

Incidentally, with respect to the microbe type biodegradable plastic, microbe-produced copolymer polyester obtained from β-hydroxybutyrc acid and β-hydroxyvaleric acid is commercially available in the product name of BIOPOL. On the other hand, as those on development, one obtained through biopolyester biosynthesis by microbes and alkali genus bacteria, a biopolymer produced from a kind of acetic acid bacteria, one, for effective use in sewage treatment, which produces bio-composable polyester in a fungus body of a microbe, and the like are Known.

On the other hand, with respect to the chemical synthesis type biodegradable plastic, aliphatic polyester (product name: BIONOLLE) synthesized by a condensation polymerization method using glycol and aliphatic dicarboxylic acid as materials, on (product name: LACTY) produced through ring-opening polymerization of ring dimers of lactic acid, high molecular weight row polycaprolactone (product name: PLACCEL-H) based on aliphatic linear polyester, aliphatic polyester resin polycaprolactone (product name; TONE) and the like are commercially available. On the other hand, as those on development, one in the form of copolymer obtained through chemical synthesis based on aliphatic ester, one in the form of biodegradablefiber, and the like are known.

Further, with respect to the natural high molecular weight type biodegradable plastic, polymer alloy (product name: MATER-BI) with denaturation PVA including starch as a main component or the like, one (product name: NOVON) produced by adding natural or synthetic additives to starch as a main component, and the like are commercially available. On the other hand, as those on development, one in the form of copolymer of chitosan, cellulose and starch, one obtained by adding starch to polycaprolactone, and the like are known.

On the other hand, since a magnetic characteristic at the composite magnetic body 3 has a plurality of magnetic resonances appearing at mutually different frequency regions, a desired magnetic loss characteristic is obtained over wideband frequency regions.

Specifically, such a composite magnetic body 3 can ensure the safety upon disposal thereof and facilitate the recycling as described above, and further, can have a desired excellent high frequency permeability characteristic and provide electric non-conductivity, so as to be effective for impedance matching with the space as an electric wave absorbing body.

Here, by forming such a composite magnetic body 3 into a thin plate and stacking it on a metal thin plate, there can be provided an electromagnetic interference suppressing body for the purpose of suppression of the electromagnetic interference. In this electromagnetic interference suppressing body, it is preferable that, among a plurality of magnetic resonances appearing at mutually different frequency regions of the composite magnetic body 3, the magnetic resonance appearing at the lowest frequency region is at a frequency region lower than the lower limit of a desired electromagnetic interference suppressing frequency band.

The electromagnetic interference suppressing body can be obtained by forming a dielectric layer on the surface of the composite magnetic body 3 and multilayering along with a conductive support such as a wire net. In this stacked structure, there is an effect that an eddy current loss is reduced. When actually mounting such an electromagnetic interference suppressing body at an electromagnetic interference suppressing portion of a high frequency electronic device, it is used as being cut to a proper size.

Figure 2:
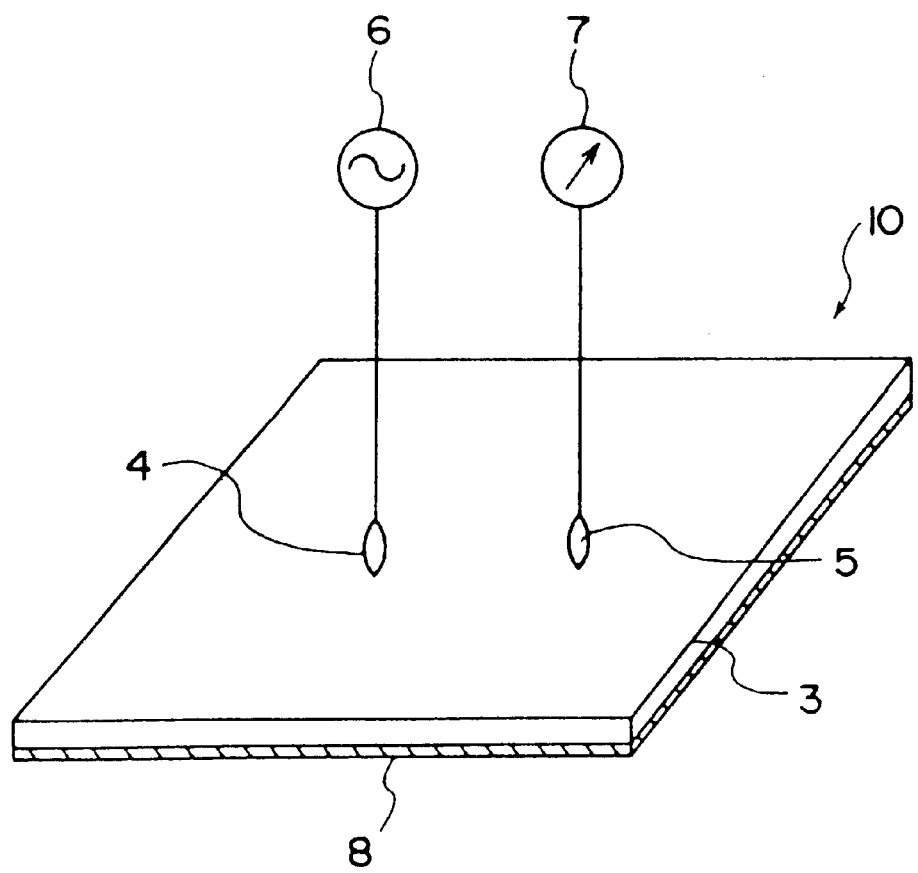
FIG. 2 is a perspective view showing a schematic structure of an evaluating apparatus used for characteristic evaluation of an electromagnetic interference suppressing body using the composite magnetic body shown in FIG. 1.

A characteristic of the thus produced electromagnetic interference suppressing body can be examined by a characteristic evaluating apparatus as shown in FIG. 2. This evaluating apparatus is constituted by disposing a micro-loop antenna 4 connected to an electromagnetic wave generator 6 and a micro-loop antenna 5 connected to an electromagnetic field strength measuring device 7 such as a network analyzer near an electromagnetic interference suppressing body 10 formed by stacking the composite magnetic body 3 on a copper plate 8 and at the side of the composite magnetic body 3 thereof. The composite magnetic body 3 backed with the copper plate 8 and having a thickness of 2 mm and a length of one side being 20 cm was used as the electromagnetic interference suppressing body 10, and the micro-loop antennas 4, 5 having a loop diameter of 1.5 mm were used.

In the evaluating apparatus, an electromagnetic wave of a given strength is radiated toward the electromagnetic interference suppressing body 10 from the electromagnetic wave generator 6 via the micro-loop antenna 4, and a coupling level relative to the electromagnetic interference suppressing body 10 is measured by the electromagnetic field strength measuring device 7 via the micro-loop antenna 5, so that the capability of the electromagnetic interference suppressing body 10 can be evaluated.

Then, hereinbelow, the producing processes, the magnetic characteristic and the electromagnetic interference suppressing capability of the composite magnetic body 3 will be explained concretely.

When producing the composite magnetic body 3, a plurality of Fe—Si alloy powder and Fe—Al—Si alloy powder produced by a water atomizing method and having different magnetostriction constants $\lambda$ are first prepared. Then, they are subjected to milling, drawing and tearing processes under various conditions using an attriter and a pin mill. Subsequently, while introducing nitrogen-oxygen mixed gas at a 35% oxygen partial pressure, they are agitated for 8 hours in a hydrocarbon organic solvent and subjected to a liquid-phase acid removing process. Then, they are subjected to a classifying process so that a plurality of powder samples having different anisotropic magnetic fields are obtained. As a result of analyzing the surfaces of the obtained powder, the generation of metal oxides was clearly confirmed so that the presence of oxide films on the surfaces of the sample powder was confirmed.

With respect also to samples obtained by drying under reduced pressure the Fe—Si alloy powder and the Fe—Al—Si alloy powder subjected to the milling, drawing and tearing processes and applying thereto a gas-phase acid removing process in an atmosphere of nitrogen-oxygen mixed gas at a 20% oxygen partial pressure, metal oxides were detected on the surfaces thereof. Accordingly, it was confirmed that the soft magnetic powder oxidized at least on the surfaces thereof which could be used as the composite magnetic body 3 could be produced by the liquid-phase acid removing method or the gas-phase acid removing method.

Further, as concrete verification examples about the production and the magnetic characteristic of the composite magnetic body 3, the following samples 1 to 3 can be cited. For measurement of a magnetic characteristic about each sample, a composite magnetic body sample formed into a toroidal shape was used. By inserting it into a test fixture forming a one-turn coil and measuring an impedance thereof, a real part permeability $\mu'$ and a magnetic resonance frequency fr were derived.

[Sample 1]

Sample 1 was obtained by preparing soft magnetic paste having a composition of 95 weight parts of flat soft magnetic (Fe—Al—Si alloy) fine powder A [mean particle diameter: $\phi=20$ $\mu m \times 0.3$ $\mu m^t$, magnitude of magnetostriction: +0.72, annealing: none], 8 weight parts of any one of products of the foregoing microbe type biodegradable plastic, chemical synthesis type biodegradable plastic and natural high molecular weight type biodegradable plastic as the organic binding agent 1, 2 (two) weight parts of a curing agent (isocyanate compound) and 40 weight parts of a solvent (cellosolve mixed solvent), forming it into a film by a doctor blade process, applying hot pressing thereto, and then curing it at 85° C. for 24 hours.

As a result of analyzing sample 1 using a scanning electron microscope, a particle orientation direction was an in-film surface direction of the sample. Further, of sample 1, a powder filling rate was 30%, a real part permeability $\mu'$ was 14, and a magnetic resonance frequency fr was 50 MHz.

Here, the magnitude of the magnetostriction represents a value of deformation magnitude $dl/l \times 10^{-6}$ at H=200 Oe.

[Sample 2]

Sample 2 was obtained by preparing soft magnetic paste having a composition of 95 weight parts of flat soft magnetic (Fe—Al–Si alloy) fine powder B [mean particle diameter: $\phi=20$ $\mu m \times 0.3$ $\mu m^t$, magnitude of magnetostriction: +0.72, annealing condition: 650° C., 2 hours], 8 weight parts of any one of products of the foregoing microbe type biodegradable plastic, chemical synthesis type biodegradable plastic and natural high molecular weight type biodegradable plastic as the organic binding agent 1, 2 weight parts of a curing agent (isocyanate compound) and 40 weight parts of a solvent (cellosolve mixed solvent), forming it into a film by a doctor blade process, applying hot pressing thereto, and then curing it at 85° C. for 24 hours.

As a result of analyzing sample 2 using a scanning electron microscope, a particle orientation direction was an in-film surface direction of the sample. Further, of sample 2, a powder filling rate was 29%, a real part permeability $\mu'$ was 16, and a magnetic resonance frequency fr was 30 MHz.

[Sample 3]

Sample 3 was obtained by preparing soft magnetic paste having a composition of 9 weight parts of flat soft magnetic (Fe—Al—Si) fine powder E [mean particle diameter: $\phi=20$ $\mu m \times 0.4$ $\mu m^t$, magnitude of magnetostiction, almost 0], 8 weight parts of any one of products of the foregoing microbe type biodegradable plastic, chemical synthesis type biodegradable plastic and natural high molecular weight type biodegradable plastic as the organic binding agent 1, 2 weight parts of a curing agent (isocyanate compound) and 40 weight parts of a solvent (cellosolve mixed solvent), forming it into a film by a doctor blade process, applying hot pressing thereto, and then curing it at 85° C. for 24 hours.

As a result of analyzing sample 3 using a scanning electron microscope, a particle orientation direction was an in-film surface direction of the sample. Further, of sample 3, a powder filling rate was 31%, a real part permeability $\mu'$ was 17, and a magnetic resonance frequency fr was 25 MHz.

Figure 3:
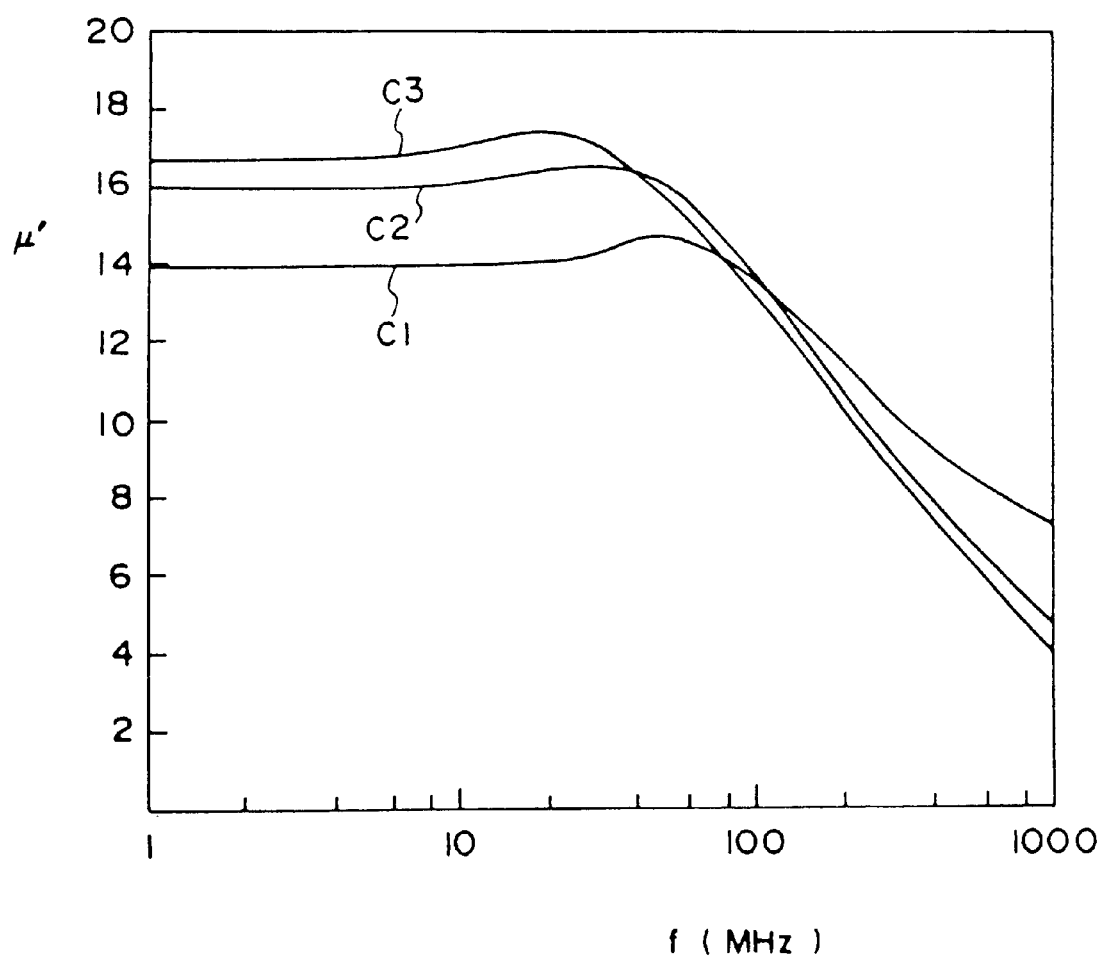
FIG. 3 shows results of examination about transmittance characteristics relative to frequencies as magnetic characteristics of examples, of the composite magnetic body shown in FIG. 1, having different anisotropic magnetic fields.

FIG. 3 shows measured values of real part permeability ($\mu'$) relative to frequencies f (MHz) of sample 1, sample 2 and sample 3 by curves C1, C2 and C3.

In the same figure, it is seen that the magnetic resonance frequency fr is the highest with respect to sample 1 using the magnetic powder having a positive magnetostriction constant $\lambda$. The value of the real part permeability $\mu'$ is the largest with respect to sample 3 whose magnetostriction constant is $\lambda$ almost 0. On the other hand, with respect to sample 2 represented by the curve C2 wherein the magnetic powder obtained by applying the annealing to the magnetic powder used in sample 1 was used as material powder, the magnetic resonance frequency fr and the real part permeability $\mu'$ both take values between sample 1 and sample 3.

From these results, it is seen that, with respect to the biodegradable plastic, the product belonging to any type gives no influence to the magnetic characteristic and can be used as the organic binding agent of the composite magnetic body. With respect to the magnetic characteristic, it is seen that the frequency characteristic of the permeability can be controlled over a wide range by setting the magnetostriction constant $\lambda$ to a value other than 0 and further changing a residual deformation magnitude by annealing.

INDUSTRIAL APPLICABILITY

As described above, according to the composite magnetic body of the present invention and the electromagnetic interference suppressing body using it, since the biodegradable plastic is used as the organic binding agent in the composite magnetic body as the insulting soft magnetic body formed by dispersing the flat soft magnetic powder into the organic binding agent and holding the desired magnetic characteristic, and since the iron powder or the alloy powder including at least Fe and Si is used as the soft magnetic powder, the safety upon disposal thereof can be ensured to enhance the recyclability.

What is claimed is:

1. A composite magnetic body comprising flat soft magnetic powder dispersed in an organic agent, which is characterize in that said organic binding agent is of plastic selected form the group consisting of microbe-produced copolymer polyester, biosynthesized biopolyester, a biopolymer produced from a kind of acetic acid bacteria, plastic which produces bio-degradable polyester in a fungus body of a microbe, plastic produced through ring-opening polymerization of ring dimmers of lactic acid, and copolymer of chitosan.

2. A composite magnetic body as recited in claim 1, characterized in that said soft magnetic powder is iron powder or alloy powder comprising Fe and Si.

3. A composite magnetic body as recited in claim 1, characterized in that said composite magnetic body has a plurality of magnetic resonance appearing at mutually different frequency regions.

4. A composite magnetic body as recited in claim 1, characterized in that said plastic is in the form of synthetic fibers.

5. An electromagnetic interference suppressing body characterized by comprising the composite magnetic body as recited in claim 1, and a conductive material.

6. An electromagnetic interference suppressing body as recited in claim 5, characterized in that said composite magnetic body has a plurality of magnetic resonance appearing at mutually different frequency regions.

* * * * *